United States Patent
Brochi et al.

(10) Patent No.: US 11,808,804 B2
(45) Date of Patent: Nov. 7, 2023

(54) POWER PROFILING IN AN INTEGRATED CIRCUIT HAVING A CURRENT SENSING CIRCUIT

(71) Applicant: NXP USA, Inc., Austin, TX (US)

(72) Inventors: Antonio Mauricio Brochi, Campinas (BR); Felipe Ricardo Clayton, Campinas (BR)

(73) Assignee: NXP USA, Inc., Austin, TX (US)

( * ) Notice: Subject to any disclaimer, the term of this patent is extended or adjusted under 35 U.S.C. 154(b) by 121 days.

(21) Appl. No.: 17/247,516

(22) Filed: Dec. 15, 2020

(65) Prior Publication Data

US 2022/0187358 A1    Jun. 16, 2022

(51) Int. Cl.
*G01R 31/28* (2006.01)
*G01R 31/30* (2006.01)
*G01R 31/3185* (2006.01)

(52) U.S. Cl.
CPC ..... *G01R 31/2851* (2013.01); *G01R 31/3004* (2013.01); *G01R 31/318575* (2013.01)

(58) Field of Classification Search
CPC .... G01R 31/28; G01R 31/2851; G01R 31/30; G01R 31/3004; G01R 31/3185; G01R 31/318575; G01R 19/00; G01R 19/15; G01R 19/0092; G01R 19/16571; G01R 19/16552; G06F 1/3287
See application file for complete search history.

(56) References Cited

U.S. PATENT DOCUMENTS

| 4,902,965 | A | * | 2/1990 | Bodrug | ............ G01R 21/1331 379/106.05 |
|---|---|---|---|---|---|
| 7,072,779 | B2 | | 7/2006 | Hancock et al. | |
| 8,732,487 | B2 | | 5/2014 | Goraczko et al. | |
| 8,892,931 | B2 | * | 11/2014 | Kruglick | ............ G06F 1/3203 713/340 |
| 9,904,343 | B2 | | 2/2018 | Jeon | |
| 10,145,938 | B2 | | 12/2018 | Wursthorn et al. | |
| 2004/0008016 | A1 | * | 1/2004 | Sutardja | ............ H02M 3/157 323/283 |
| 2012/0130657 | A1 | | 5/2012 | Eckert et al. | |

(Continued)

FOREIGN PATENT DOCUMENTS

JP          5132468 B2 *  1/2013

OTHER PUBLICATIONS

U.S. Appl. No. 17/022,929, Clayton, Felipe Ricardo: "On-Chip, Low-Voltage, Current Sensing Circuit", filed Sep. 16, 2020.

*Primary Examiner* — Son T Le

(57) ABSTRACT

An integrated circuit (IC) includes subcircuits, power switches coupled to pass load current to a respective one of the subcircuits when activated by a respective switch control signal, and sensing circuits. Each of the sensing circuits is coupled to a respective one of the subcircuits, wherein the sensing circuits are configured to generate sense currents that are proportional to the respective load currents. The IC also includes a conversion circuit configured to receive at least one of the sense currents and to convert the at least one of the sense currents to an equivalent multi-bit digital signal, a timestamp circuit configured to generate a timestamp value that is correlated with the multi-bit digital signal, and a controller configured to provide signals to operate the power switches and the sensing circuits.

20 Claims, 8 Drawing Sheets

(56) References Cited

U.S. PATENT DOCUMENTS

| | | | |
|---|---|---|---|
| 2015/0241486 A1* | 8/2015 | Christensen ......... | H05K 7/1492 |
| | | | 324/105 |
| 2016/0268079 A1* | 9/2016 | Kim .................... | H01H 47/001 |
| 2022/0029410 A1* | 1/2022 | Fukuhara ........... | G01R 19/0092 |

* cited by examiner

POWER PROFILING IN AN INTEGRATED CIRCUIT HAVING A CURRENT SENSING CIRCUIT

BACKGROUND

Current measuring circuits formed on integrated circuits (IC) can measure load currents or currents consumed by IC subcircuit blocks. A control system manages the subcircuits based on the measured load currents. For example, a control system may compare a load current for a subcircuit to a threshold value. If the load current exceeds the threshold value, the control system can reduce the load current by reducing the speed at which the subcircuit operates, deactivating the subcircuit, etc.

BRIEF DESCRIPTION OF THE DRAWINGS

The present technology may be better understood, and its numerous objects, features, and advantages made apparent to those skilled in the art by referencing the accompanying drawings.

The use of the same reference symbols in different drawings indicates similar or identical items.

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts.

In an IC, current consumption of components with a device can be measured, which, in addition to knowing the applied voltages, can be used to determine power consumption of the components. The power consumption of the different components can be measured, monitored, and correlated to the execution of software routines over time. A power profile can then be generated for the execution of the software routines. This power profile can be used in a variety of ways to optimize power consumption within the IC. In one embodiment, the current sensors which measure current consumption in components of the IC are used to provide, for each component or set of components, a series of digital pulses in a 50% duty cycle square wave, in which the frequency or period of this square wave is proportional to the current flowing to each component. A system shared time-stamp of the IC can be used in combination with the square waves to generate a power profile (which identifies power consumption over time).

Figure 1A:
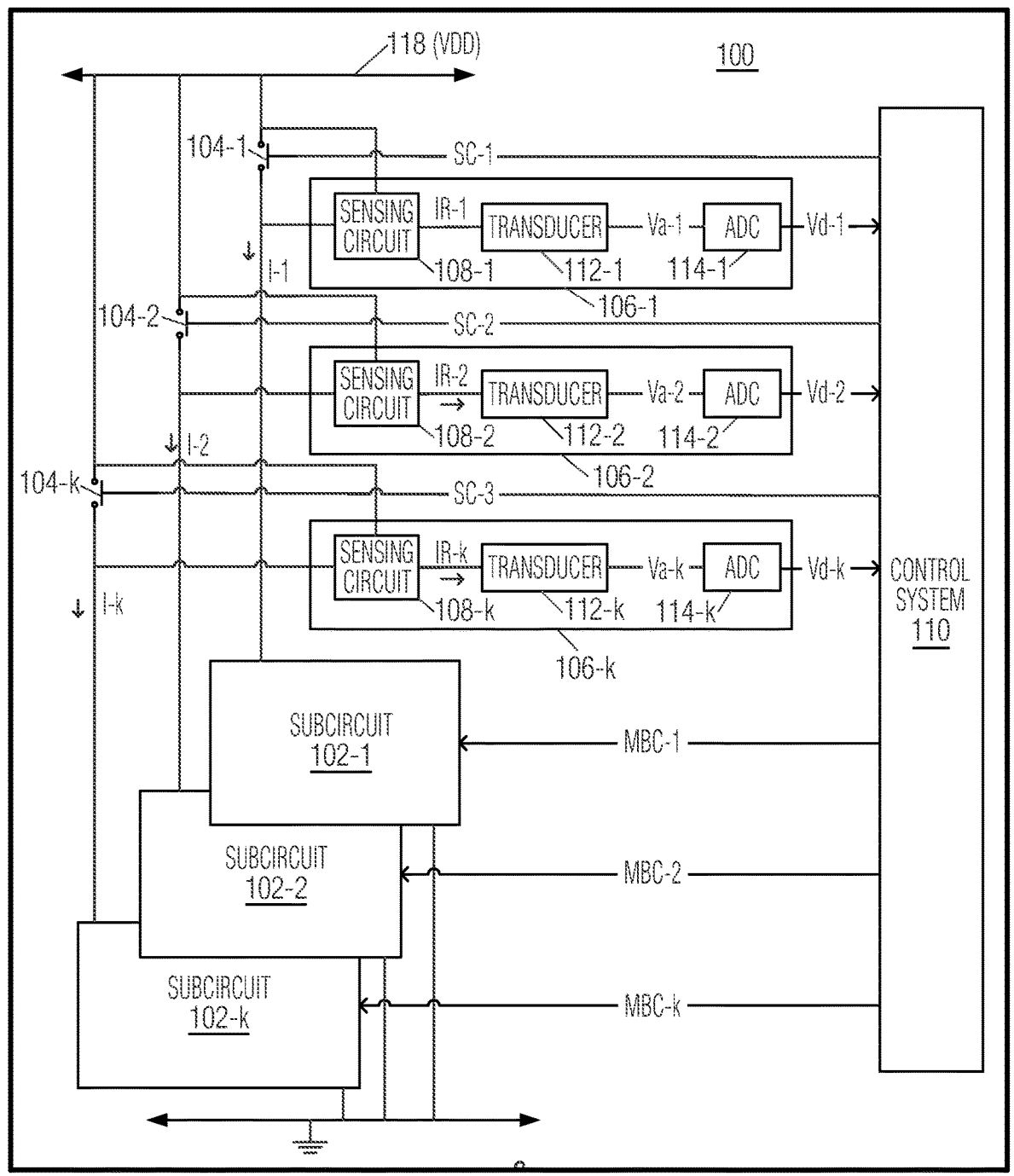
FIG. 1A is a block diagram that illustrates an example IC that includes current measurement circuits, in accordance with one embodiment of the present invention.

FIG. 1A is a block diagram of an IC 100 that contains subcircuits 102, power switches 104, current measurement circuits 106, and a control system 110. Switches 104 selectively couple respective subcircuits 102 to a conductor 118 that provides a supply voltage VDD. Current measurement circuits 106 measure load currents I (e.g., I-1) that are passed to respective subcircuits 102 (e.g., subcircuit 102-1). As will be more fully described, control system 110 manages power switches 104 and subcircuits 102 based on measured load currents I.

Control system 110 controls power switches 104 via respective switch control (SC) signals. For example, control system 110 can activate or close power switch 104-1 by asserting SC-1, or control system 110 can deactivate or open power switch 104-1 by deasserting SC-1. When supply VDD is available, each activated switch 104 provides supply voltage Vdd and accordingly conducts load current I to its corresponding subcircuit 102. Control system 110 also manages subcircuits 102 via respective multibit control MBC signals. For example, control system 110 can activate or deactivate subcircuit 102-1 (e.g., a digital signal processor or DSP) via MBC-1. When deactivated, a subcircuit should not consume current. In addition control system 110 can control operational aspects of subcircuits 102 that affect current consumption. For example, control system 110 can increase or decrease the speed at which subcircuit 102-1 operates via MBC-1. Control system 110 may open a switch 104 while its corresponding subcircuit 102 is disabled to eliminate any current leakage.

Each current measurement circuit 106 in FIG. 1 includes a current sensing circuit 108 that generates a replica current IR, which is proportional to its corresponding load current I. Each current measurement circuit 106 also includes a transducer 112 and an analog-to-digital converter (ADC) 114. Each transducer 112 converts the replica current IR it receives into an analog voltage Va with a magnitude that is proportional to IR. Each ADC 114 converts the analog voltage Va it receives into an equivalent multibit digital value Vd. Control system 110 receives the digital values Vd from the ADCs 114.

Control system uses multibit digital values Vd to control switches 104 and manage subcircuits 102. For example, control system 110 may compare a predetermined value Threshold-1 to Vd-1, which is proportional to load current I-1 passed to subcircuit 102-1. If Vd-1 exceeds Threshold-1, then control system 110 may take steps to reduce load current I-1 consumed by subcircuit 102-1. For example control system 110 may reduce the speed at which subcircuit 102-1 operates, shut down the subcircuit 102-1, etc., via multibit control signal MBC-1. In addition or alternatively, control system 110 may deactivate corresponding switch 104-1 if Vd exceeds Threshold-1. If Threshold-1 exceeds Vd-1, control system 110 may take steps to increase load current I-1 such as, for example, increasing the operating speed of subcircuit 102-1. Control system 110 may sum digital values Vd provided by all of ADCs 114, and compare the summed value to an upper limit imposed by a customer (e.g., a device manufacturer that incorporates the IC 100 into a device). The upper limit (e.g., make the upper limit a condition of using the IC) is set to prevent IC 100 from overheating and/or malfunctioning. If the summed value approaches the upper limit, then control system 110 may take steps to reduce overall current consumption by subcircuits 102 such as by reducing the operating speed of one or more subcircuits 102, shutting down one or more subcircuits 102, deactivating one or more switches 104, etc.

Figure 1B:
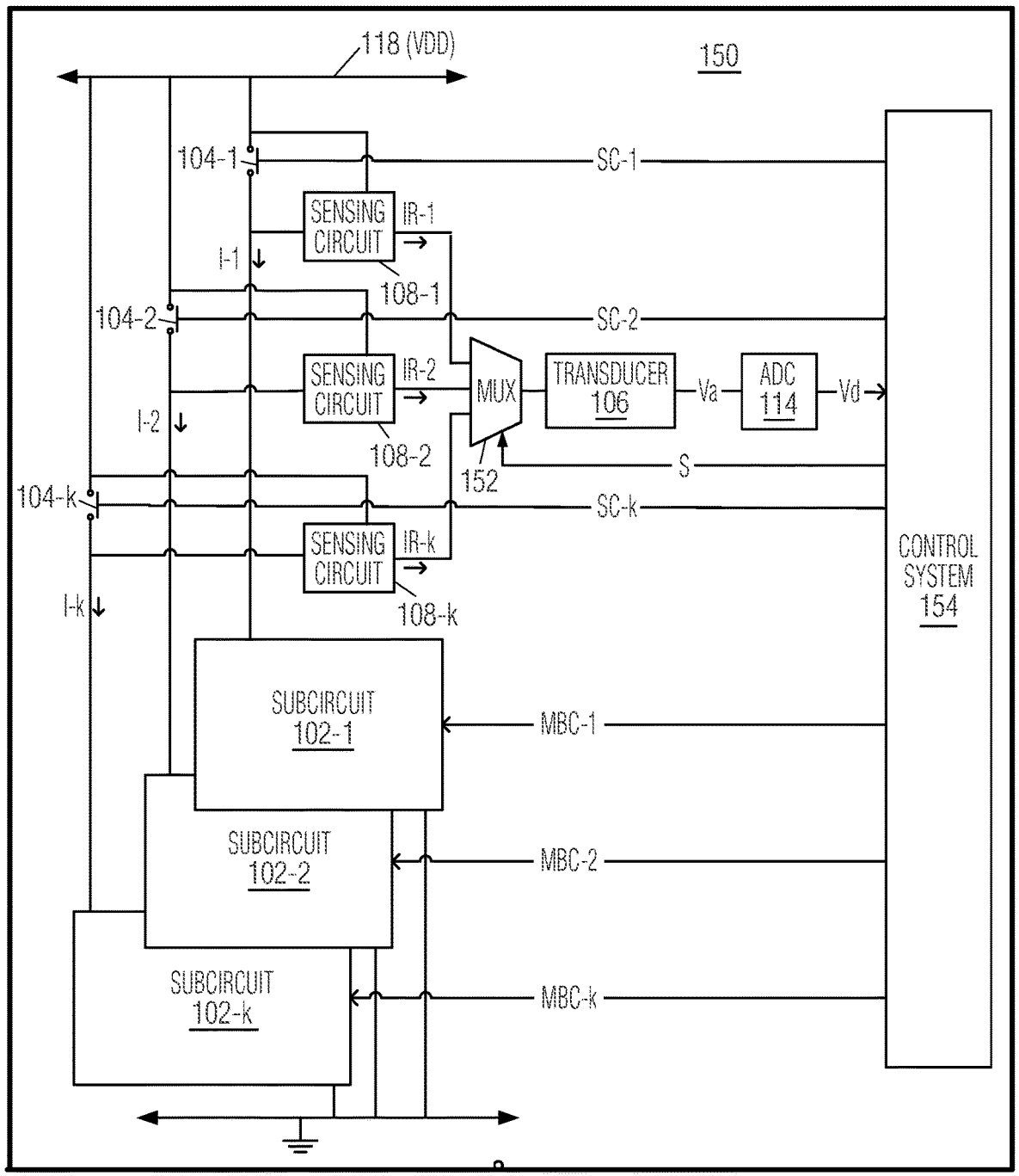
FIG. 1B is a block diagram that illustrates an another IC that includes current measurement circuits, in accordance with one embodiment of the present invention.

Transducers 112 and ADCs 114 occupy substantial area of the substrate upon which IC 100 is formed. In addition transducers 112 and ADCs 114 consume power, which can be a problem if IC is contained in a portable device that is powered by a battery. FIG. 1B is a block diagram of an IC 150 that mitigates these problems. IC 150 is similar to IC 100 shown in FIG. 1A, but with a single transducer 106 and a single ADC 114. In addition, IC 150 includes a multiplexer 152 controlled by control system 154 via selector signal S issued. Multiplexer 152 is configured to receive replica currents IR-1-IR-k from respective sensing circuits 108. Based upon the selector signal S, multiplexer 152 couples the output of one of the sensing circuits 108 to transducer 106. Transducer 106 converts the replica current IR it receives from multiplexer 152 into an analog voltage Va equivalent. ADC 100 converts Va into a multibit digital value Vd for subsequent processing by control system 154. Sensing circuits 108 and subcircuits 102 are managed by control system 154 in response to processing digital value Vd. Compared to IC 100, IC 150 lacks multiple transducers 106 and ADCs 114. However reductions in substrate area and power obtained by reducing the number of transducers 106 and ADCs 114 is offset by the addition of multiplexer 152. In addition, control system 154 is more complex than control system 110 since control system 154 must coordinate selection signal S with the appropriate processing of multibit digital signal Vd in order to accurately manage switches 104 and subcircuits 102. Importantly, both control systems 110 and 154 receive and process multibit digital signals Vd that represent respective load currents.

Figure 2:
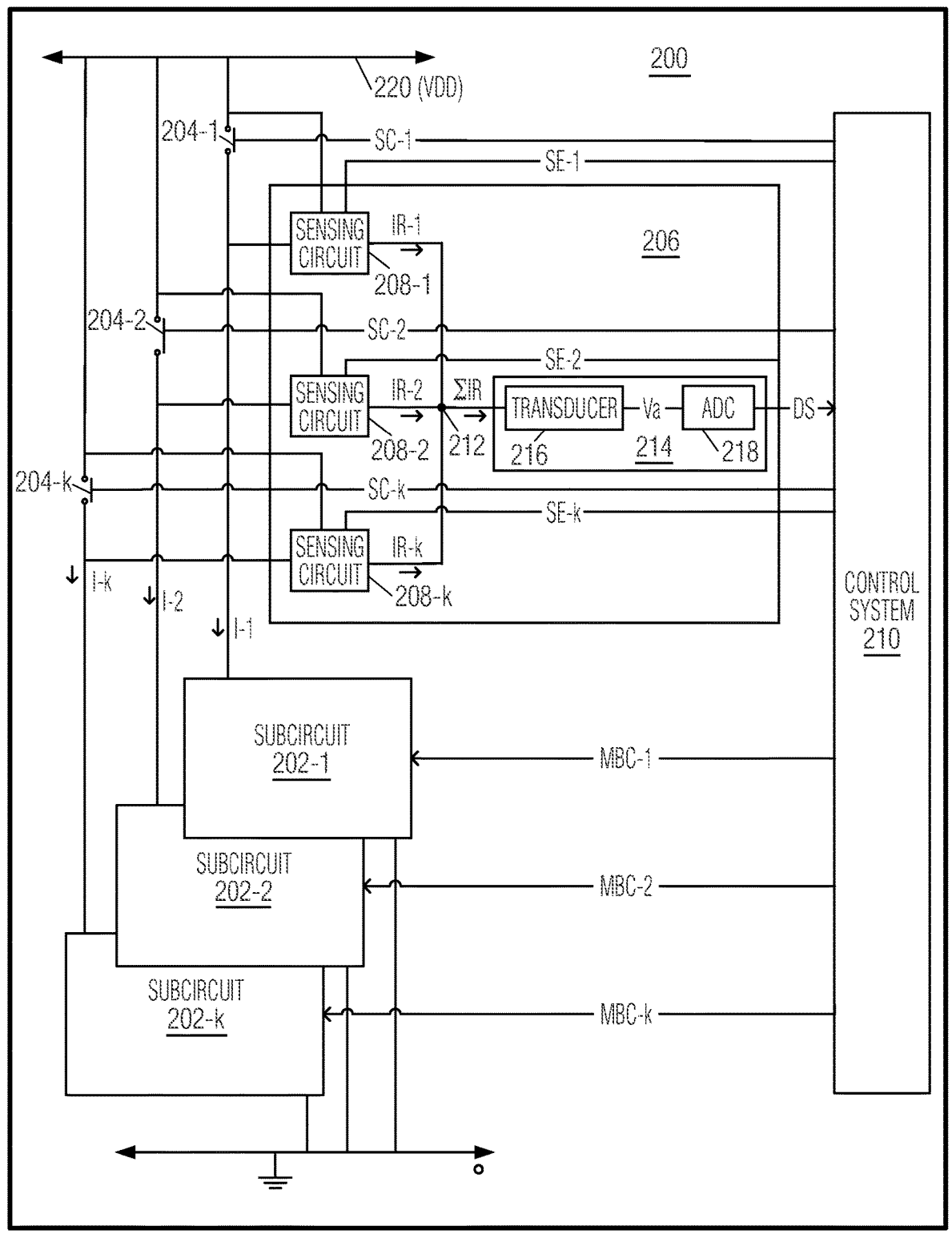
FIG. 2 is a block diagram illustrating an example IC that includes current measurement circuit, in accordance with one embodiment of the present invention.

FIG. 2 is a block diagram showing relevant components of an IC 200 (e.g., a microcontroller, microprocessor, system on a chip, etc.) employing an on-chip current measurement circuit which addresses problems described above. IC 200 contains k subcircuits 202 (e.g., CPUs, GPUs, DSP cores, memory, I/O ports, etc.) with distinct size, structure and function. IC 200 also includes power switches 204, current measurement circuit 206, control system 210, and a conductor or rail 220 that provides supply voltage VDD. FIG. 2 shows an equal number of subcircuits 202, power switches 204, and current sensing circuits 208. In an alternative embodiment, the number of subcircuits 202 may differ from the number of power switches 204 or current sensing circuits 208.

Switches 204 selectively couple respective subcircuits 202 to supply voltage VDD. FIG. 2 shows one supply rail 220. In an alternative embodiments, switches 204 may selectively couple subcircuits 202 to respective rails that provide supply voltages of equal or different magnitudes. In yet another embodiment a first group of switches 204 may selectively couple one group of subcircuits 202 to a first rail that provides a first supply voltage, while a second set of switches 204 may selectively couple another group of subcircuits 202 to a second rail that provides a second supply voltage, and so on.

Control system 210 can manage subcircuits 202, power switches 204, and current measurement circuit 206. Control system 210 may take form in a processor and a memory that stores instructions executable by the processor. In this embodiment control system 210 can process multibit digital signal DS received from current measurement circuit 206 in accordance with instructions stored in the memory. As will be more fully described below, multibit digital signal DS may represent one load current or a summation of two or more load currents. Alternative control systems 210 may include several subsystems (e.g., a multi core (e.g., CPU) device, finite state machines, etc.) that communicate with each. For example, control system 210 may include a CPU and finite state machines in data communication with the CPU. The CPU can generate control values based on processing DS in accordance with instructions stored in memory. The finite state machines can manage subcircuits 202, power switches 204, and current measurement circuit 206 based on the control values received from the CPU. Other embodiments of control system 210 are contemplated.

Current measurement circuit 206 includes k current sensing circuits 208, each of which generates a replica current IR (e.g., IR-1) that is proportional to load current I (e.g., I-1) passed to a corresponding subcircuit 202 (e.g., subcircuit 202-1). Some of the subcircuits 202 may draw substantially more load current than other subcircuits 202. Each current sensing circuit 208 should be designed with a capability to sense the largest load currents drawn by its corresponding subcircuit 202. If the range in which a current sensing circuit can sense current is too small, the current sensing circuit's ability to accurately measure its corresponding load current may be compromised. To illustrate, if the current sensing range of a current sensing circuit 208 is limited to X mA, and the load current I is X+10 mA, current sensing circuit 208 will generate a replica current IR that is proportional to X mA, not X+10 mA (in other words, the current sense output will saturate). In one embodiment, sensing circuits 208 have equal current sensing ranges, each large enough to cover the maximum load current drawn by any of subcircuits 202. In an alternative embodiment, several sensing circuits 208 may have different current sensing ranges. For example, a first group of one or more of sensing circuits 208 may have a current sensing range that is greater than that for a second group of one or more sensing circuits. The current sensing range of one or more, or all of sensing circuits 208 may be static, or the current sensing range of one or more, or all of sensing circuits 208 can be adjusted during operation of IC 200.

Control system 210 controls power switches 204 via respective SC signals. For example, control system 210 can individually activate any one of switches 204 by asserting the appropriate SC signal, or control system 210 can individually deactivate any one of the switches 204 by deasserting the appropriate SC signal. Control circuit 210 can activate a subgroup of switches 204 by concurrently asserting the appropriate SC signals, or control system 210 can deactivate a subgroup of switches 204 by concurrently deasserting the appropriate SC signals. Control system 210 can activate all switches 204 by concurrently asserting all SC signals, and control system 210 can deactivate all switches 204 by concurrently deasserting all SC signals. Each switch 204 when activated passes load current I to its corresponding subcircuit 202. Control system 210 may deactivate a switch 204 while its corresponding subcircuit 202 is disabled in order to reduce or eliminate any leakage current therefrom. A subcircuit 202 may be disabled while its corresponding switch 204 is activated so that the subcircuit can be promptly restarted and resume its function in a short amount of time. And of course, control system 210 may concurrently activate corresponding subcircuits 202 and switches 204.

In addition to controlling switches 204, control system 210 can manage subcircuits 202 via respective multibit control MBC signals. For example, control system 210 can individually enable or disable each of the subcircuits 202, concurrently enable or disable a group of subcircuits 202, or concurrently enable or disable all subcircuits 202. When disabled, current may leak from a subcircuit 202. Control system 210 can individually control operational parameters or behaviors, such as operating speed, of subcircuits 202 via respective MBC signals. For ease of illustration FIG. 2 includes individual paths for passing MBC signals from control system 210 to respective subcircuits 202. In an alternative embodiment, a common data bus can be used to pass MBC signals between the control system 210 and subcircuits 202. In another embodiment, control system 210 can generate an interrupt values based on DS. The interrupt values can be delivered to subcircuits 202, which take the appropriate actions in response to receiving interrupt values.

Control system 210 controls current sensing circuits 208 via sense enable SE signals. In an alternative embodiment, current sensing circuits are controlled by the same switch control SC signals that control switches 204. However, the remainder of this description will presume that current sensing circuits 208 are controlled by respective sense enable SE signals. When activated by an asserted sense enable signal SE, each current sensing circuit 208 is configured to generate a replica current IR, which is proportional to the load current I passed by its corresponding switch 204. Replica current IR should be a small fraction of its corresponding load current I in order to reduce power consumption. Replica currents IR can be summed at node 212 to produce a summed current $\Sigma IR$. Current measurement circuit 206 includes a conversion circuit 214 for converting summed current $\Sigma IR$ into multibit digital equivalent DS. In the embodiment shown in FIG. 2, conversion circuit 214 includes a transducer 216 and an analog-to-digital converter (ADC) 218, it being understood that conversion circuit 214 may take other forms (e.g., current controlled oscillator and digital timer, trans-impedance amplifier or resistor plus an ADC, etc). Transducer 216 converts summed current $\Sigma IR$ into an analog voltage signal Va with a magnitude that is proportional to the magnitude of $\Sigma IR$. ADC 218 converts the analog voltage signal Va into a corresponding multibit digital value DS. Control system 210 receives and processes DS from ADC 218.

Transducer 216's replica current capability limits the effective IR output range of the sensing circuits 208. The IR limit of each current sensing circuit 208's range should be compatible with the capability of transducer 216 to detect replica current. If not, the transducer's ability to generate an accurate analog voltage Va representation of the replica current, may be compromised. To illustrate, if the replica current capability of transducer 216 is limited to X mA, and the replica current IR produced by a sensing circuit 208 is X+10 mA, transducer 216 will generate an analog voltage Va that is proportional to X mA, not X+10 mA. In one embodiment, sensing circuits 208 should be designed so that the limit of each of their replica current output ranges is compatible with the replica current capability of transducer 216. In an alternative embodiment, sensing circuits 208 in a group of two or more may designed so that the limits of their replica current output ranges when added together (i.e., $\Sigma IR$ limits), is compatible with the replica current capability of transducers 216.

Only one transducer 216 and one ADC 218 is employed in FIG. 2. In contrast, FIG. 1A shows k transducers 112 and k ADCs 114. Assuming the transducers and ADCs of FIG. 1 are the same size as transducer 216 and ADC 214, the substrate area occupied by conversion circuit 214 in IC 200 should be less than the substrate area collectively occupied by transducers 112 and ADCs 114 in IC 100. Further, the amount of power dissipated by transducer 216 and 218, should be less than the power dissipated by transducers 112 and ADCs 114 of IC 100. In addition, conversion circuit 214 lacks multiplexer 152 shown in FIG. 1B. Also, multibit digital signal DS may represent one load current or a summation of two or more load currents. In contrast digital values Vd represent only load currents passed to respective subcircuits 102.

Control system 210 can monitor current, and thus power, consumed by subcircuits 202, either individually or collectively. For example, control system 210 may monitor current consumed by subcircuit 202-1 via enabled sensing circuit 208-1, while some or all switches 204 and some or all subcircuits 202 are activated by control system 210. With only sensing circuit 208-1 enabled $\Sigma I=IR-1$, and DS represents IR-1, which in turn is proportional to I-1. Control system 210 may compare a predetermined value Threshold-1 to DS. If DS exceeds Threshold-1, control system 210 can adjust operational aspects of subcircuit 202-1 to reduce its current consumption. For example, control system 210 may reduce the operating speed of subcircuit 202-1 via multibit signal MBC-1 until DS is less than Threshold-1. Lowering the operating speed of a subcircuit 202 can reduce the current, and thus power, consumed by the subcircuit 202. Alternatively control system 210 may disable subcircuit 202-1 in response to comparing DS to Threshold-1. In addition or alternatively, control system 210 may deactivate corresponding switch 204-1 if DS exceeds Threshold-1. Conversely if Threshold-1 exceeds DS, control system 210 may increase load current I-1, for example, by increasing the operating speed of subcircuit 202-1 until DS equals Threshold-1. Other subcircuits 202 can be individually monitored in similar fashion. For example, control system 210 may disable sensing circuit 208-1, and enable sensing circuit 208-2 while some or all switches 204 and subcircuits 202 are activated. In this configuration $\Sigma I=IR-2$, and DS represents IR-2, which in turn is proportional to I-2. Control system 210 may compare a predetermined value Threshold-2 to DS, where Threshold-2 is the same as or different from Threshold-1. If DS exceeds Threshold-2, control system 210 can adjust operational aspects of subcircuit 202-2 via multibit signal MBC-2. For example, control system 210 may reduce the operating speed of subcircuit 202-2 until the load current I-2 consumed by subcircuit 202-2 is less than Threshold-2. Or control system 210 may disable subcircuit 202-2. In addition or alternatively, control system 210 may deactivate corresponding switch 204-2 if DS exceeds Threshold-2. If Threshold-2 exceeds DS, control system 210 may increase load current I-2 consumed by subcircuit 202-2 by increasing the operating speed of subcircuit 202-2 via MBC-2 until DS equals Threshold-2.

Control system 210 may monitor groups of subcircuits 202. For example, control system 210 may concurrently activate all switches 204 and sensing circuits 208, while enabling all subcircuits 202. In this configuration, $\Sigma IR$ equals the sum of all replica currents IR-1-IR-k which in turn corresponds to a sum of load currents I-1-I-k. Control system 210 may compare a predetermined value Threshold-all to DS. If DS exceeds Threshold-all, then control system 210 control system 210 can adjust operational aspects of one or more of subcircuits 202 via respective one or more of multibit control signals MBC-1-MBC-k to reduce total current consumption. For example, control system 210 may lower the operating speed of one or more of the subcircuits 202 until DS is less than Threshold-all. In addition or alternatively, control system 210 may deactivate one or more switches 204, or disable one or more subcircuits until DS is less than Threshold-all. If Threshold-all exceeds DS, the control system 210 may increase the total load current consumed by subcircuits 202-1-202-k by adjusting one or more of the multibit control signals MBC-1-MBC-k.

A subgroup of subcircuits 202 can be monitored in similar fashion. For example, control system 210 can monitor current consumed by subcircuits 202-1 and 202-2 via activated sensing circuits 208-1 and 208-2, while some or all switches 204 are activated, and while some or all remaining subcircuits 202 are enabled. In one embodiment, sensing circuits 208-1 and 208-2 may have the same current sensing ranges and the same IR output limits. In another embodiment, sensing circuits 208-1 and 208-2 may have different current sensing ranges abilities and/or different IR limits. With only sensing circuits 208-1 and 208-2 enabled ΣIR should equal the sum of replica currents IR-1 and IR-2, which in turn corresponds to a sum of load currents I-1 and I-2. Control system 210 may compare a predetermined value Threshold-1:2 to DS. If DS exceeds Threshold-1:2, then control system 210 can adjust operational aspects of one or both of subcircuits 202-1 and 202-2 via one or both of multibit control signals MBC-1 and MBC-2 to reduce current consumption. Alternatively, control system 210 can adjust operational aspects of one or more of the other subcircuits 202 (e.g., subcircuit 202-k) in order to reduce current consumed by the one or more other subcircuits. If Threshold-1:2 exceeds DS, the control system 210 may increase the load current consumed by subcircuits 202-1-202-k.

Figure 3:
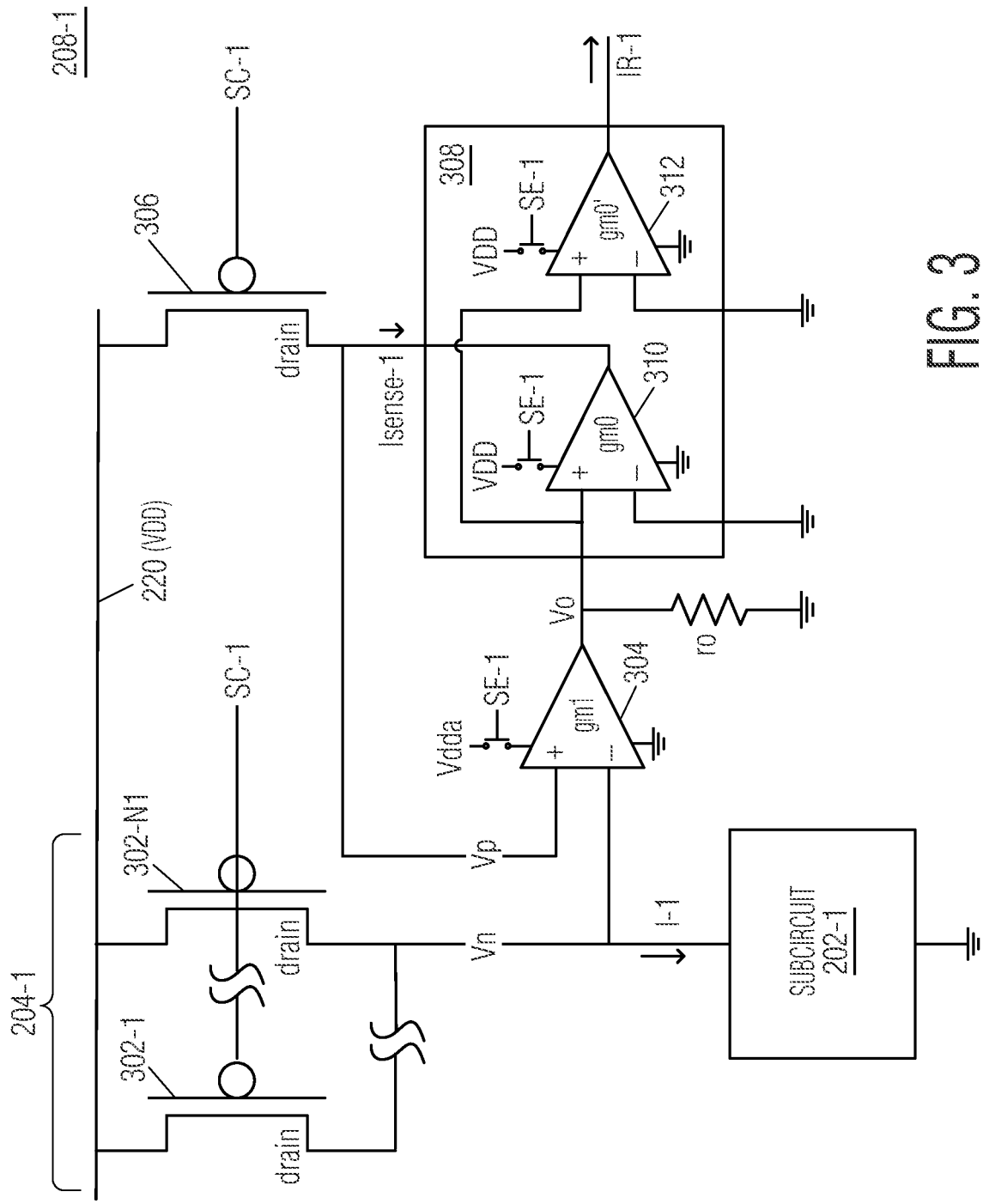
FIG. 3 is a schematic diagram that illustrates an example current sensing circuit employed in FIG. 2.

FIG. 3 is a schematic diagram of an example of sensing circuit 208-1 shown in FIG. 2. Sensing circuits 208-2-208-k can be similar or identical in structure to that shown in FIG. 3. Alternatively several sensing circuits 208 may differ in structure so that they have different current sensing ranges and/or IR limits. Sensing circuit 208-1 is coupled to switch 204-1 and subcircuit 202-1 (e.g., a DSP). In this embodiment, switch 204-1 takes form in N1, P-channel MOSFETs 302 with gates controlled by the same control signal SC-1, where N1 is an integer. Sensing circuit 208-1 includes a MOSFET 306 with a gate controlled by SC-1. In an alternative embodiment, MOSFET can be controlled by sense enable signal SE-1. However, the remaining disclosure will presume that MOSFET 306 is controlled by SC-1. The channel widths and lengths of MOSFETs 302 are presumed equal to the channel width and length of MOSFET 306, it being understood the present disclosure should not be limited thereto.

Sensing circuit 208-1 includes a high gain amplifier 304 having a transconductance gm1 and an ideal offset (i.e., Vos1=0V). Amplifier 304 has an inverting input coupled to subcircuit 202-1 and the drains of MOSFETs 302, and a noninverting input coupled to the drain of a MOSFET 306. The output of amplifier 304 is coupled to the input of a low voltage, transconductor and current copier (TCC) 308 and ground. An additional amplifier (not shown) could be inserted between amplifier 304 and TCC 308 to enhance gain in an alternative embodiment. Resistor r0 represents inherent resistance of the output of amplifier 304 to ground.

The combination of amplifier 304 and TCC 308 forces the drains of MOSFETs 302 and MOSFET 306 to approximately the same voltage. Since the gates of MOSFETs 302 and 306 are controlled by SC-1, and since MOSFETs 302 and 306 are presumed equal in size, current Isense-1 passed by activated MOSFET 306 should be close to if not identical to the current passing by each of the MOSFETs 302. In other words Isense-1=(I-1)/N1, so long as amplifier 304 has a high gain, and offset voltage Vos1=0V.

TCC 308 includes a pair of low voltage transconductance amplifiers 310 and 312 with transconductances gm0 and gm0', respectively, where gm0'=M1*gm0. In the embodiment shown, amplifiers 310 and 312 are powered by supply voltage VDD while amplifier 304 is powered by a different supply voltage Vdda. All amplifiers 304, 310, and 312 are connected to their respective supply voltages via respective switches, which are closed directly, or indirectly via a logic gate structure, when SE-1 is asserted. Sensing circuit 208-1 is deactivated when the switches are open. When SE-1 is asserted, an output voltage Vo of amplifier 304 is input to both noninverting inputs of amplifiers 310 and 312. Both inverting inputs of amplifiers 310 and 312 are grounded. The output of amplifier 310 is coupled to the drain of P-channel MOSFET 306. Amplifier 312 outputs replica current IR-1 to transducer 216 (not shown in FIG. 3). Since gm0'=M1*gm0, replica current IR-1 can be represented as IR-1=M1*(I-1)/N1.

As noted above, sensing circuits 208 may have different current sensing ranges or output IR limits. M1 and N1 are scaling factors that affect the current sensing ranges and/or IR limits. An increase in N1 increases the capability of switch 204-1 to pass load current. Since Isense-1=(I-1)/N1, an increase in N1 reduces Isense-1 proportionally for the same load current I-1. An increase in N1 leads to a reduction in Isense-1, which increases the current sensing range of sensing circuit 208-1 since a larger load current I-1 can be passed by switch 204-1 before Isense-1 reaches its saturation limit. Thus, a larger load current I-1 can be sensed when N1 is increased. A decrease in M1 will decrease the IR limit of current sensing circuit 208-1, and vice versa. To illustrate the foregoing principles, presume sensing circuit 208-1 has scaling factors N1=100 and M1=1, while sensing circuit 208-2 has scaling factors N2=200 and M2=1. Further presume that transducer 216 has a replica current capability limit of 0.5 mA. Due to the limitation of transducer 216, IR-1 and IR-2 should be limited to 0.5 mA. With IR-1=0.5 mA=M1*(I-1)/N1=1*(I-1)/100, then I-1=50 mA is the limit of sensing circuit 208-1's current sensing range. With IR-2=0.5 mA=M2*(I-2)/N2=1*(I-2)/200, then I-2=100 mA is the limit of sensing circuit 208-2's current sensing range. However, with these scaling factors, IR-1 and IR-2 cannot be summed at node 212 if I-1=50 mA and I-2=100 mA, since, ΣIR=IR-1+IR-2>0.5 mA, the replica current capability of transducer 216. Rather, I-1 and I-2 should be measured individually. However, if the transconductance ratios are changed to M1=0.3 and M2=0.6, for example, with N1=100, N2=200, I-1=50 mA, and I-2=100 mA, then IR-1=0.15 mA and IR-2=0.3 mA, and accordingly, IR-1 and IR-2 can be summed at node 212 since the summed current ΣIR will be less than 0.5 mA, the limit of transducer 216's replica current capability. In one embodiment, control system 210 can adjust the transconductance ratios M for one or more sensing circuits 208 by reconfiguring amplifier 308. Transconductance ratios M for sensing circuits 208 that have unequal scaling factors N, can be adjusted so that the sensing circuits have convenient current sensing ranges, and as a result their replica currents, when summed, accurately measure the corresponding load currents I.

Figure 4:
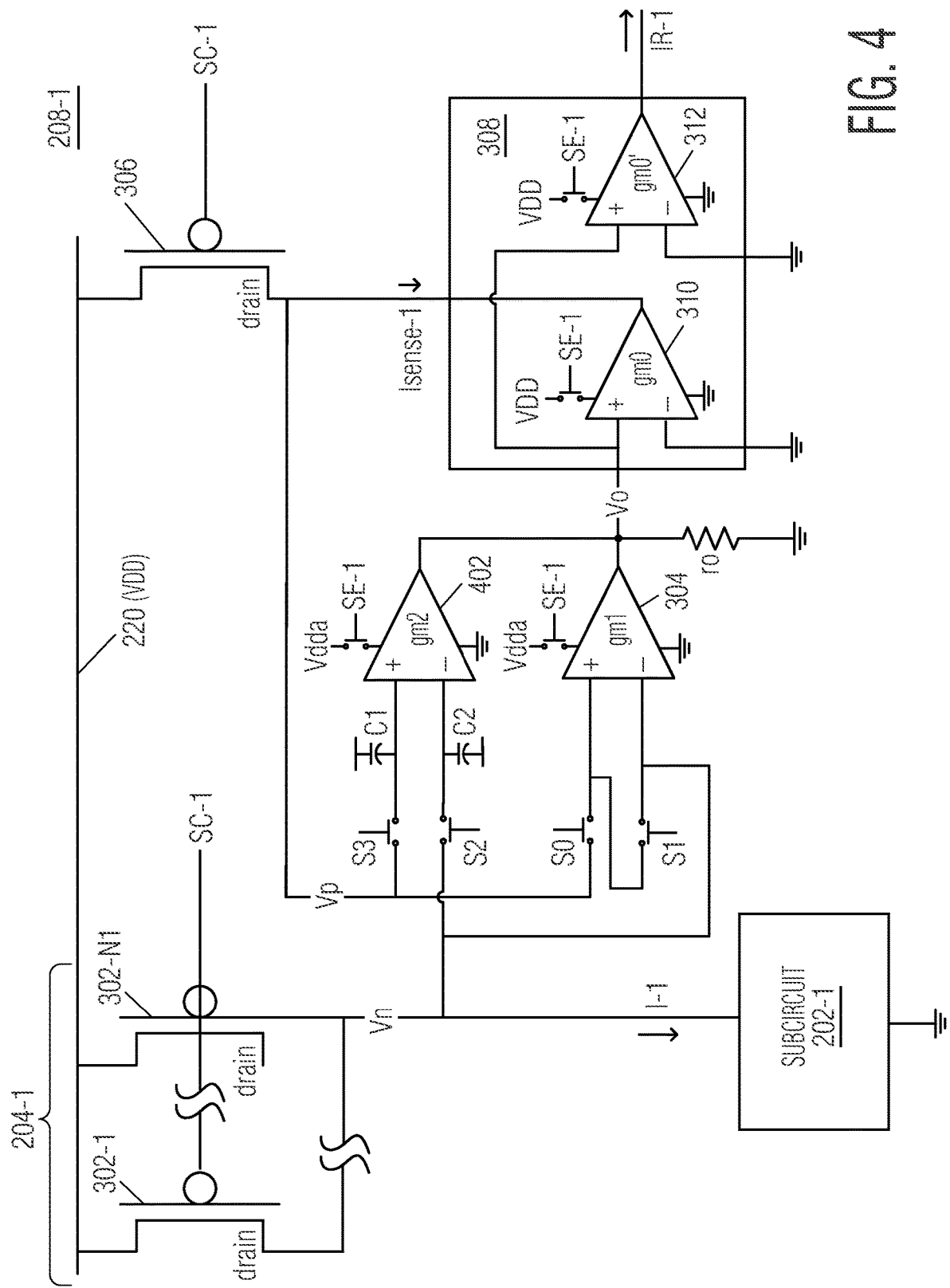
FIG. 4 is a schematic diagram that illustrates an example current sensing circuit employed in FIG. 2.

The output current IR-1 from TCC 308 is linearly dependent on current I-1 if the offset voltage of amplifier 304 is low (i.e., Vos1=0V). Otherwise, the dependence between current IR-1 and I-1 may not be linear. FIG. 4 illustrates the sensing circuit 208-1 of FIG. 3 with an amplifier 402 that is added to compensate for an amplifier 304 that has an offset voltage Vos1 high enough to affect linearity. Amplifier 402 has a transconductance gm2, which differs from gm1. In addition the sensing circuit shown in FIG. 4 includes an array of switches S0-S3, which are coupled as shown to the inverting and noninverting inputs of amplifiers 402 and 304. Although not shown, switches S0-S3 can be controlled by control system 210. Holding capacitors C1 and C2 are connected between the inputs of amplifier 402 and a common voltage point (e.g., ground).

Sensing circuit 208-1 shown in FIG. 4 has two modes of operation. A calibration is performed in the first mode in which switches S1, S2, and S3 are closed while switch S0 is opened. Current I-1 should not be measured during the first mode. Capacitors C1 and C2 are charged in the first mode to hold a voltage difference between the drain voltages at MOSFET 306 and MOSFETS 302, respectively. This allows the effect of the non-zero voltage offset Vos1 of amplifier 304 to be sampled. Then sensing circuit 208-1 switches to the second mode, where switches S1-S3 are opened and switch S0 is closed. The voltage difference between capacitors C1 and C2 forces amplifier 402 to output a current that compensates for the current from amplifier 304 created by the non-zero offset voltage Vos1. Current I-1 can be measured in the second mode. Importantly, the differential voltage held at capacitors C1 and C2 cancels the effect of the non-zero offset voltage Vos1 of amplifier 304, resulting in a more accurate current IR-1 at the output of TCC 308.

Figure 5:
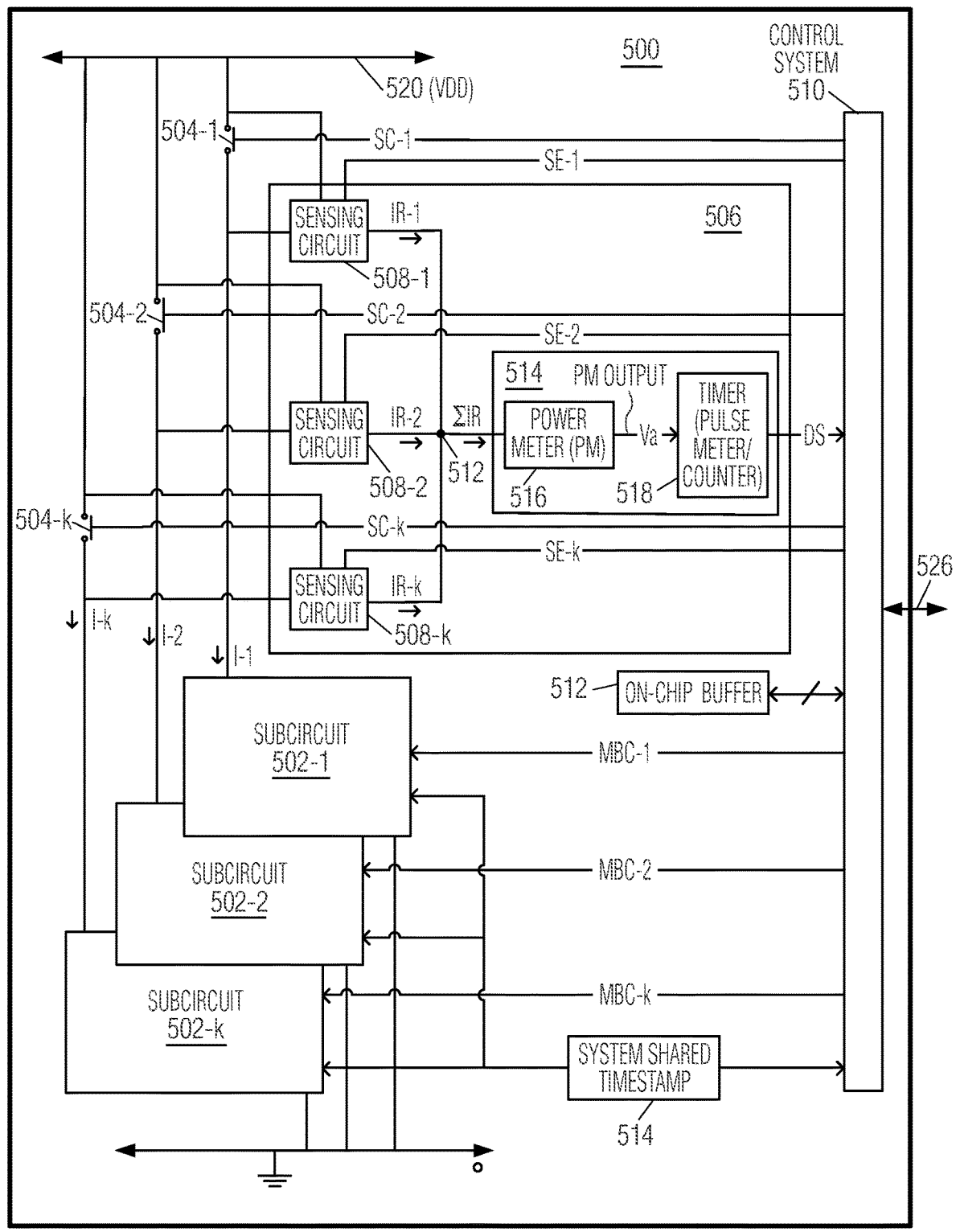
FIG. 5 is a block diagram illustrating another IC that includes current measurement circuits, in accordance with one embodiment of the present invention.

FIG. 5 is a block diagram showing relevant components of an IC 500 (e.g., a microcontroller, microprocessor, system on a chip, etc.) employing an on-chip current measurement circuit which is similar to IC 200 of FIG. 2, in which like reference numerals indicate like elements. However, IC 500 includes a current measurement circuit 506 to produce DS (which is different from current measurement circuit 206), and a control system 510 which may include some or all of the functionality of control system 210, but also includes additional functionality, as will be described below. IC 500 also includes an on-chip buffer 512 (which can be any type of on-chip storage circuitry), and a system shared timestamp 514 which provides a global or universal timestamp to subcircuits 502 and control system 510. Note that all the different possibilities and configurations described above for current sensing circuits 208, switches 204, and subcircuits 202 also apply to IC 500. Similarly, some or all the functionality of control system 210 to provide control signals SE and MBC may also apply to control system 510 of IC 500.

Current measurement circuit 506 includes sensing circuits 508 and a conversion circuit 514 for converting summed current ΣIR into multibit digital equivalent DS. In the embodiment shown in FIG. 5, conversion circuit 514 implements an alternate embodiment of conversion circuit 214. Conversion circuit 514 includes a power meter (PM) 516, which produces a PM output, and a timer which produces DS using the PM output. PM 516 receives summed current ΣIR and produces a series of digital pulses such that the PM output is a 50% duty cycle square wave. The frequency or period of the PM output is proportional to summed current ΣIR. Each pulse of the PM output corresponds to an amount of electrical charge transferred to the corresponding one or more monitored subcircuits 502 (those subcircuits whose load currents are included in summed current ΣIR) through the corresponding one or more activated switches 504. In one embodiment, PM 516 is implemented as a current control oscillator (CCO). In alternate embodiments, any known circuit may be used to convert the input current (summed current ΣIR, in this example) to the square wave (or to any digital signal capable of transporting current information). Timer 518 may include a pulse meter or counter which determines the frequency or period of the square wave provided as PM output to timer 518. Timer 518 may be any circuit which can measure the frequency or period of a square wave. Therefore, in this embodiment, the multibit digital signal DS at the output of timer 518 represents a time-based current measurement, corresponding to either the measured frequency or the measured period of the PM output.

As discussed above in reference to control system 210, control system 510 may monitor groups of subcircuits 502. For example, control system 510 may concurrently activate all switches 504 and sensing circuits 508, while enabling all subcircuits 502. A subgroup of subcircuits 502 can be monitored in similar fashion. For example, control system 510 can monitor current consumed by subcircuits 502-1 and 502-2 via activated sensing circuits 508-1 and 508-2, while some or all switches 504 are activated, and while some or all remaining subcircuits 502 are enabled. Therefore, a monitored subcircuit can be any subcircuit being monitored or any subcircuit within a group of subcircuits being monitored. In the example of FIG. 5, a monitored subcircuit is a subcircuit whose load current is included as part of summed current ΣIR, in which summed current ΣIR can include one or more load currents from one or more monitored subcircuits.

A power controller (PC) CPU 520, or other processing element, within control system 510 is coupled to receive DS from current measurement circuit 506 and converts the received measured frequency or measured period into current units (e.g. microamps (uA)), using, for example, a conversion equation. This may be done with software running on power controller CPU 520. Power controller CPU 520 may also apply a calibration factor to the conversion to remove non-linearities of sensing circuits 508. In one embodiment, power controller CPU 520 is a dedicated CPU which is separate from any CPU in subcircuits 502. Power controller CPU 520 may be powered by an independent power domain of IC 500 (e.g. independent from VDD provided by rail 520) so as not to interfere with the current measurement of the monitored subcircuits. Also, through the use of a dedicated CPU for power controller CPU 520, application software running within any of the monitored subcircuits is isolated from the current measurement software in power controller CPU 520 such that the application software power profile on the monitored subcircuits is not disturbed by the software running on power controller CPU 520.

The measured currents determined by power controller CPU 520 of control system 510 correspond to the power consumption of the monitored subcircuits. For example, one subcircuit may include a digital signal processing (DSP) CPU, a second subcircuit may include a real time CPU, and a third subcircuit may include an application CPU. The software running on each of these subcircuits affects the power consumption of each subcircuit. By using the measured currents from the monitored subcircuits, power controller CPU 520 can determine a power profile which can then be linked to the running of particular software.

IC 500 includes system shared timestamp 514 which generates the same timestamp to control system 510 (and thus power controller CPU 520) and to subcircuits 202. This allows power controller CPU 520 to correlate application software instruction execution in a monitored subcircuit to the current measurements. The current measurements, along with the voltage level of the monitored subcircuit, allow power controller CPU 520 to determine the power consumed by the monitored subcircuit. Therefore, in one embodiment, each subcircuit of subcircuits 502 can be individually monitored, in turn, to determine the corresponding power consumed.

Figures 6, 7:
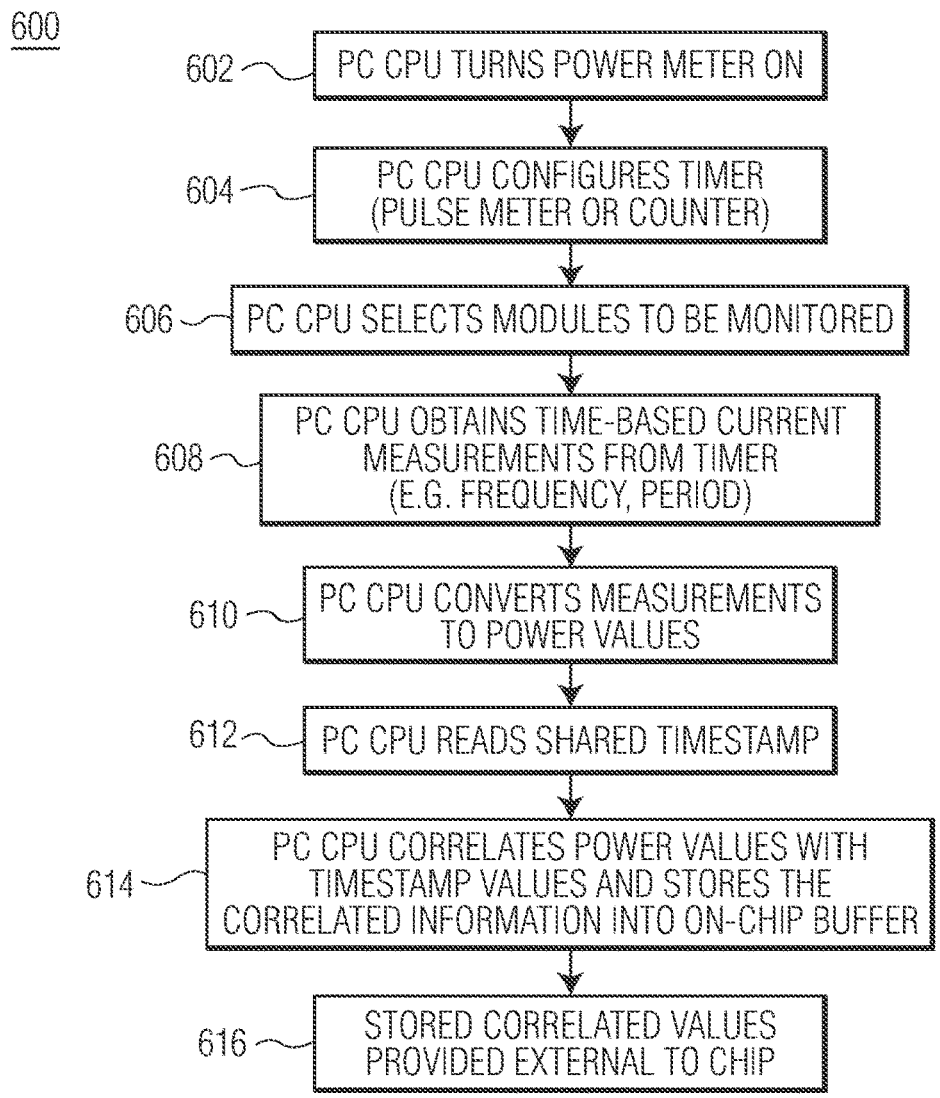
FIG. 6 is a flow diagram illustrating a method of obtaining power values using the IC of FIG. 5, in accordance with one embodiment of the present invention.
FIG. 7 is a table illustrating an example of power values and time stamps for the IC of FIG. 5, in accordance with one embodiment of the present invention.

FIG. 6 illustrates a flow diagram 600 for operation of power controller CPU 520 (referred to in FIG. 6 as PC CPU). In block 602, PC CPU turns on (i.e. enables) PM 516 and, in block 604, configures timer 518 which may include configuring the pulse meter or counter. In block 606, PC CPU selects the modules (subcircuits) to be monitored. This can be done through control system 510 by enabling the desired switches 204 and sensing circuits 208 corresponding to one or more selected subcircuits of subcircuits 202. In one embodiment, only one subcircuit is selected such that the summation current ΣIR corresponds to the load current of the one selected subcircuit. In block 608, PC CPU obtains the time-based current measurements (e.g. DS) from timer 518, in which these current measurements may represent the frequency or period of the PM output. At block 610, PC CPU converts the time-based current measurements into power values, by converting the measurements to current and using the voltage level of the selected subcircuit to determine the power consumption. At block 612, PC CPU obtains the global timestamp by reading system shared timestamp 524.

Next, at block 614, the PC CPU correlates the power values with the timestamp values and stores the correlated information into on-chip buffer 522. For example, FIG. 7 illustrates a table with a list of timestamps (including time 1, time 2, time 3, etc., to time N), with each timestamp having a corresponding power value (represented as mA of current, in the illustrated embodiment). Alternatively, the voltage level of the selected subcircuit can be used to instead directly store the correlated power value as V*I. In this manner, the power profile for the selected subcircuit over time is generated. These values, at block 616, can also be provided external to IC 500 (such as via external terminals 526 of IC 500).

Knowing the power profile over time for each subcircuit of a selected set of subcircuits, correlations can be made using this information with software running on the monitored subcircuits. In one example, this power monitoring can help identify differential power analysis (DPA) attacks. DPA attacks are a method used to steal internal device secret information, such as secret keys. For example, by observing the power profile when a specific software is running, an attacker can try to infer the secrete key being used in a cryptographic application. However, the power profile generated by PC CPU 520 allows an application software developer to trace the power profile of the application by correlating power measurements with a shared timestamp when the application is running. Detecting peaks in the power consumption allows the application software developer to identify regions more suitable for DPA attacks. With this information, a crypto software routine can be modified by the application software developer to minimize those power peaks and reduce its power profile.

Figure 8:
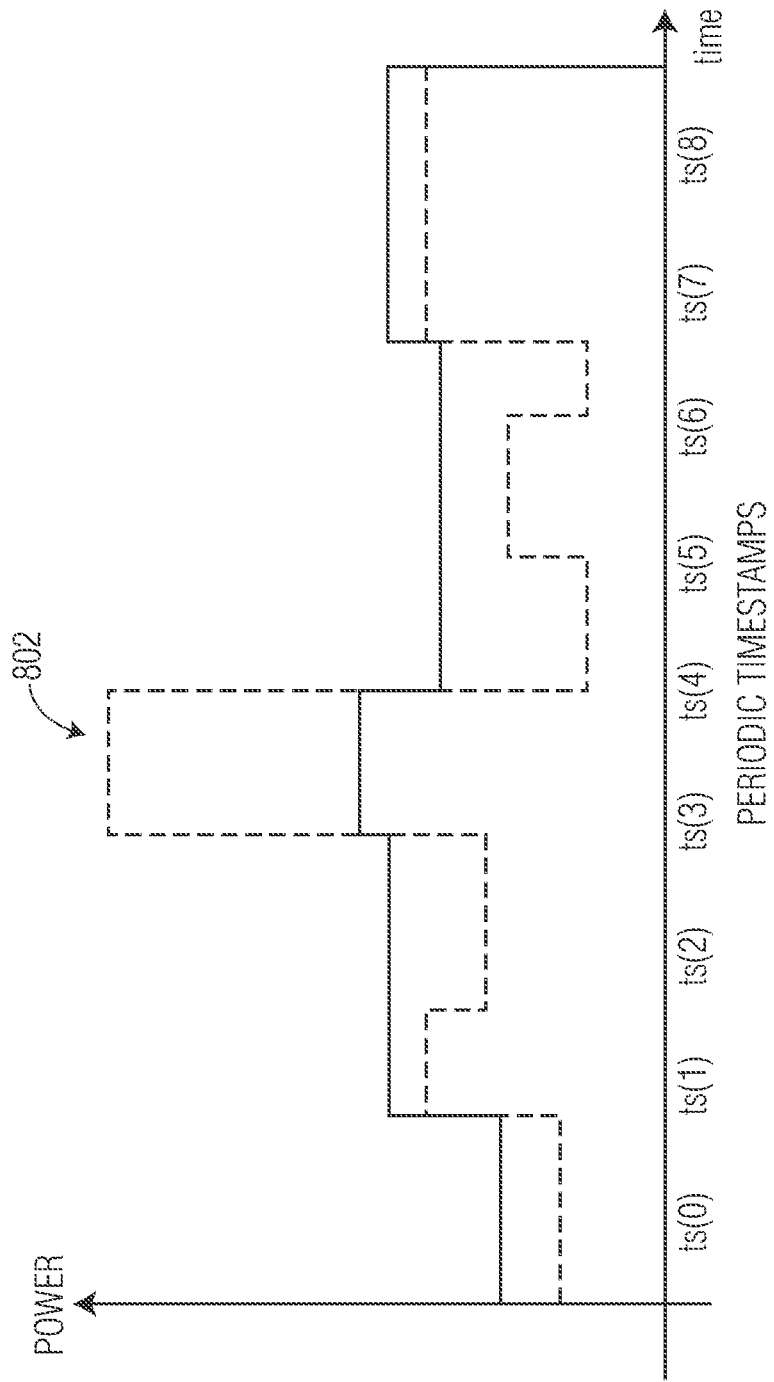
FIG. 8 is a timing diagram illustrating example power profiles for a cryptographic software routine.

For example, FIG. 8 illustrates, in timing diagram form, the power profiles of two implementations of the same cryptographic software routine. In the illustrated embodiment, the power profiles illustrate power consumption over time, in which the time spans nine periodic timestamps (ts(0)-ts(8)). The dotted line power profile corresponds to the power profile of the initial cryptographic routine, prior to any further modifications, and the solid line to the modified cryptographic routing with reduced power peaks. Therefore, PC CPU 520, with current measurement circuit 506, can obtain the power profile of the initial cryptographic routine in which power peak 802 is identified. The cryptographic software routine can be modified by, for example, re-arranging the instruction execution or adding dummy instructions, such that the power peaks are reduced and are not detectable. Since PC CPU 520 is a dedicated power controller, the power profile of a specific subcircuit (containing, e.g., a specific processing element or CPU) can be individually monitored.

Current measurement circuit 506 and PC CPU 520 can also be used to indicate that the power consumption of a specific subcircuit, or summation of power for selected subcircuits, meet a predefined maximum limit. This can be done to protect an IC from overheating. The shared timestamp can provide the software developer the ability to identify the software routines that should be modified to reduce power. The power profile systems described herein can also be used to detect fabrication defects, or to validate that the actual power consumption of internal subcircuits are within specified parameters.

Therefore, by now it can be seen how a current measurement circuit in combination with a processing element (e.g. CPU) can be used to monitor and generate power profiles for one or more specific subcircuits of an IC. Further, through the use of a shared system timestamp, software routines running on each of the monitored subcircuits can be correlated to the power consumption.

Although the present invention has been described in connection with several embodiments, the invention is not intended to be limited to the specific forms set forth herein. On the contrary, it is intended to cover such alternatives, modifications, and equivalents as can be reasonably included within the scope of the invention as defined by the appended claims.

The following includes embodiments of the present invention.

In one embodiment, an integrated circuit (IC) includes subcircuits; power switches coupled to pass load current to a respective one of the subcircuits when activated by a respective switch control signal; sensing circuits, each of the sensing circuits coupled to a respective one of the subcircuits, wherein the sensing circuits are configured to generate sense currents that are proportional to the respective load currents; a conversion circuit configured to receive at least one of the sense currents and to convert the at least one of the sense currents to an equivalent multi-bit digital signal; a timestamp circuit configured to generate a timestamp value that is correlated with the multi-bit digital signal; and a controller configured to provide signals to operate the power switches and the sensing circuits. In one aspect, the conversion circuit includes a power meter, wherein the power meter is configured to receive the at least one of the sense currents and produce a series of digital pulses of the multi-bit digital signal, each pulse corresponding to an amount of electrical charge transferred to the respective one of the subcircuits. In a further aspect, the conversion circuit further comprises a timer circuit to determine one of a frequency and a period of the digital pulses. In yet a further aspect, the timer circuit further includes one of a pulse meter and a counter to determine the one of the frequency and the period of the digital pulses. In another aspect, the controller is further configured to receive the multi-bit digital signal and convert the multi-bit digital signal into a measured value in current units. In another aspect, the controller is further configured to store the measured value with the correlated timestamp value. In a further aspect, the measured value and the correlated timestamp value are provided to generate an application software power profile for an application program running on at least one of the subcircuits corresponding to the at least one of the sense currents.

In another embodiment, a method of monitoring power consumption in an integrated circuit (IC) includes measuring current consumed by one or more subcircuits, each of the one or more subcircuits executing an application software program; converting the measured current to power values; generating timestamp values, wherein the timestamp values are correlated with the power values; and using the timestamp values and the power values to generate a power profile for the one or more subcircuits. In one aspect of the another embodiment, the method further includes controlling operation of the one or more subcircuits based on the power profile for the one or more subcircuits. In a further aspect, the method further includes storing a set of the timestamp values and the power values over a period of time. In another aspect, the method further includes generating one or more switch control signals to select which of the one or more subcircuits to include in the current measurement of the one or more subcircuits. In a further aspect, the method further includes generating signals to enable sense circuits to measure the current consumed by the one or more subcircuits. In yet another aspect, the measuring current in the one or more subcircuits includes: activating a first sensing switch to pass a first sensing current; amplifying the first sensing current from the one or more subcircuits; receiving the first sensing current and an output of the first amplifier in a first transconductor and current copier circuit; and generating a first measured current based on the output of the amplifier and the first sensing current using the first transconductor and current copier circuit. In another aspect, the method further includes using a first power supply to operate the one or more subcircuits; and using a second power supply different than the first power supply to operate a controller that controls the operation of the one or more subcircuits.

In yet another embodiment, an integrated circuit (IC) includes conductors connected to a supply voltage; subcircuits configured to execute application programs; switches, each of the switches coupled between one of the conductors and a corresponding one of the subcircuits, and configured to transmit a first load current to the corresponding one of the subcircuits when activated; sensing circuits, each of the sensing circuits having a first connection to a corresponding one of the conductors before a first terminal of a corresponding one of the switches and a second connection to the corresponding one of the conductors after a second terminal of the corresponding one of the switches, the sensing circuits are configured to generate a sensed current that is proportional to the load current; and a controller configured to provide signals used to determine power profiles of the subcircuits based on the sensed currents. In one aspect of the yet another embodiment, the IC further includes a conversion circuit configured to receive the sensed currents and to convert the sensed currents to equivalent multi-bit digital signals; and a timestamp circuit configured to generate a timestamp value that is correlated with the multi-bit digital signals. In a further aspect, the conversion circuit includes a power meter circuit coupled to receive the sensed currents and output a series of digital pulses representing a duty cycle wave having one of a frequency and a period that is proportional to the sensed currents, each of the digital pulses corresponds to an amount of load current transferred by the switches. In yet a further aspect, the conversion circuit further includes a timer circuit configured to determine the one of the frequency and the period of the digital pulses. In another aspect, the IC further includes a first power supply coupled to operate the subcircuits; and a second power supply different than the first power supply to operate at least a portion of the sensing circuits. In another aspect, the IC further includes a memory device configured to store output of the timestamp circuit and the conversion circuit.

What is claimed is:

1. An integrated circuit (IC) comprising:
   subcircuits, wherein each subcircuit is configured to execute application programs;
   power switches, each power switch coupled to pass a respective load current to a respective one of the subcircuits when activated by a respective switch control signal, wherein each power switch is coupled between a voltage rail and the respective one of the subcircuits, and when each power switch is deactivated by the respective switch control, no supply voltage is provided to the respective one of the sub circuits;
   sensing circuits, each of the sensing circuits coupled to a respective one of the subcircuits, wherein the sensing circuits are configured to generate sense currents that are proportional to the respective load currents;
   a conversion circuit configured to receive at least one of the sense currents and to convert the at least one of the sense currents to an equivalent multi-bit digital signal;
   a timestamp circuit configured to generate a timestamp value that is correlated with the multi-bit digital signal; and
   a controller configured to provide signals to operate the power switches and the sensing circuits.

2. The IC of claim 1, the conversion circuit comprises a power meter, wherein the power meter is configured to receive the at least one of the sense currents and produce a series of digital pulses of the multi-bit digital signal, each pulse corresponding to an amount of electrical charge transferred to the respective one of the subcircuits.

3. The IC of claim 2, the conversion circuit further comprises a timer circuit to determine one of a frequency and a period of the digital pulses.

4. The IC of claim 3, wherein the timer circuit further comprises:
   one of a pulse meter and a counter to determine the one of the frequency and the period of the digital pulses.

5. The IC of claim 2, wherein the controller is further configured to receive the multi-bit digital signal and convert the multi-bit digital signal into a measured value in current units.

6. The IC of claim 2, wherein the controller is further configured to store the measured value with the correlated timestamp value.

7. The IC of claim 6, wherein the measured value and the correlated timestamp value are provided to generate an application software power profile for an application program running on at least one of the subcircuits corresponding to the at least one of the sense currents.

8. A method of monitoring power consumption in an integrated circuit (IC), the method comprising:

measuring a sum of load currents consumed by a plurality of subcircuits, each of the plurality of subcircuits executing an application software program and coupled to a voltage rail via a corresponding power switch configured to transmit a respective load current to a corresponding subcircuit of the plurality of subcircuits when activated by a corresponding switch control signal, wherein no current is received by the corresponding subcircuit when the corresponding power switch is deactivated by the corresponding switch control signal;

converting the measured current to power values;

generating timestamp values, wherein the timestamp values are correlated with the power values;

using the timestamp values and the power values to generate a power profile for the one or more subcircuits.

9. The method of claim 8, further comprising:
controlling operation of the one or more subcircuits based on the power profile for the one or more subcircuits.

10. The method of claim 9, further comprising:
storing a set of the timestamp values and the power values over a period of time.

11. The method of claim 8, further comprising:
generating a plurality of switch control signals to select which of the one or more subcircuits to include in the current measurement of the sum of load currents consumed by the plurality of subcircuits.

12. The method of claim 11, further comprising:
generating signals, in addition to the plurality of switch control signals, to enable sense circuits to each separately measure the respective load current consumed by the corresponding subcircuit of the plurality of subcircuits.

13. The method of claim 8, wherein:
the measuring current in the one or more sub circuits includes:
  activating a first sensing switch to pass a first sensing current;
  amplifying the first sensing current from the one or more subcircuits;
  receiving the first sensing current and an output of the first amplifier in a first transconductor and current copier circuit; and
  generating a first measured current based on the output of the amplifier and the first sensing current using the first transconductor and current copier circuit.

14. The method of claim 9, further comprising:
using a first power supply to operate the one or more subcircuits; and
using a second power supply different than the first power supply to operate a controller that controls the operation of the one or more subcircuits.

15. An integrated circuit (IC) comprising:
conductors connected to a supply voltage;
subcircuits configured to execute application programs;
switches, each of the switches coupled between one of the conductors and a corresponding one of the subcircuits, and configured to transmit a corresponding load current to the corresponding one of the subcircuits only when activated such that when deactivated, no supply voltage is provided to the corresponding one of the subcircuits;
sensing circuits, each of the sensing circuits corresponding to a corresponding one of the switches, each of the sensing circuits having a first connection to a corresponding one of the conductors before a first terminal of the corresponding one of the switches and a second connection to the corresponding one of the conductors after a second terminal of the corresponding one of the switches, each sensing circuit configured to generate a corresponding sensed current that is proportional to the corresponding load current; and
a controller configured to provide signals used to determine power profiles of the subcircuits based on a sum of the sensed currents.

16. The IC of claim 15 further comprising:
a conversion circuit configured to receive the sensed currents and to convert the sensed currents to equivalent multi-bit digital signals; and
a timestamp circuit configured to generate a timestamp value that is correlated with the multi-bit digital signals.

17. The IC of claim 16, wherein the conversion circuit comprises:
a power meter circuit coupled to receive the sensed currents and output a series of digital pulses representing a duty cycle wave having one of a frequency and a period that is proportional to the sensed currents, each of the digital pulses corresponds to an amount of load current transferred by the switches.

18. The IC of claim 17 wherein the conversion circuit further comprises:
a timer circuit configured to determine the one of the frequency and the period of the digital pulses.

19. The IC of claim 15 further comprising:
a first power supply coupled to operate the subcircuits; and
a second power supply different than the first power supply to operate at least a portion of the sensing circuits.

20. The IC of claim 16 further comprising:
a memory device configured to store output of the timestamp circuit and the conversion circuit.

* * * * *